US010971561B2

(12) United States Patent
Tang

(10) Patent No.: US 10,971,561 B2
(45) Date of Patent: Apr. 6, 2021

(54) OLED DISPLAY PANEL AND DISPLAY DEVICE

(71) Applicant: Wuhan China Star Optoelectronics Technology Co., Ltd., Hubei (CN)

(72) Inventor: Yuejun Tang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 353 days.

(21) Appl. No.: 16/068,870

(22) PCT Filed: Apr. 19, 2018

(86) PCT No.: PCT/CN2018/083751

§ 371 (c)(1),
(2) Date: Jul. 9, 2018

(87) PCT Pub. No.: WO2019/184023

PCT Pub. Date: Oct. 3, 2019

(65) Prior Publication Data

US 2020/0357855 A1 Nov. 12, 2020

(30) Foreign Application Priority Data

Mar. 30, 2018 (CN) ........................ 201810278703.9

(51) Int. Cl.

*H01L 27/32* (2006.01)
*H01L 51/52* (2006.01)
*G06F 3/041* (2006.01)

(52) U.S. Cl.

CPC .......... *H01L 27/323* (2013.01); *G06F 3/0412* (2013.01); *H01L 27/3246* (2013.01); *H01L 27/3276* (2013.01); *H01L 51/5246* (2013.01)

(58) Field of Classification Search

CPC ............... H01L 27/323; H01L 27/3246; H01L 27/3276; H01L 51/5246; G06F 3/0412

See application file for complete search history.

(56) References Cited

U.S. PATENT DOCUMENTS 9,966,419 B2 * 5/2018 Choi .................. H01L 51/5256
2015/0162387 A1 * 6/2015 Gu ........................ H01L 27/323
345/174

(Continued)

FOREIGN PATENT DOCUMENTS

CN 205809466 U 12/2016
CN 106848095 A 6/2017

(Continued)

*Primary Examiner* — Sardis F Azongha
(74) *Attorney, Agent, or Firm* — Leong C. Lei

(57) ABSTRACT

The present invention teaches an OLED display panel which includes an array substrate, an encapsulation cover, and an organic lighting unit sealed in between by encapsulation adhesive. The OLED display panel is characterized in that a chip bonding element is configured on the array substrate. The encapsulation cover is configured with electrically connected touch electrode layer and first connection electrodes. The organic lighting unit includes a pixel definition layer. Insulating support columns are disposed on the pixel definition layer. A second connection electrode is disposed on each support column electrically connecting the chip bonding element. Each support column reaches a first connection electrode so that the first connection electrode is electrically connected to the chip bonding element. The present invention also teaches a display device incorporating the above-described OLED display panel.

18 Claims, 5 Drawing Sheets

22 23 21 2 3 12 5 4 Px 44 13 11 3 41 43 42 1

(56) References Cited

U.S. PATENT DOCUMENTS

| | | | | |
|---|---|---|---|---|
| 2015/0380467 | A1* | 12/2015 | Su | G06F 3/0412 257/40 |
| 2016/0285042 | A1* | 9/2016 | Choi | H01L 51/5246 |
| 2019/0044078 | A1* | 2/2019 | Chen | H01L 51/0097 |

FOREIGN PATENT DOCUMENTS

| | | | |
|---|---|---|---|
| CN | 107203296 | A | 9/2017 |
| CN | 107221554 | A | 9/2017 |
| CN | 107342370 | A | 11/2017 |
| CN | 107706218 | A | 2/2018 |
| KR | 20160141343 | A | 12/2016 |

* cited by examiner

OLED DISPLAY PANEL AND DISPLAY DEVICE

CROSS-REFERENCE TO RELATED APPLICATIONS

This application is a national phase entry of PCT Patent Application No. PCT/CN2018/083751, filed on Apr. 19, 2018, which claims priority to Chinese Patent Application No. 201810278703.9, filed on Mar. 30, 2018, both of which are hereby incorporated herein by reference in their entireties.

BACKGROUND OF THE INVENTION

(a) Technical Field of the Invention

The present invention is generally related to display technologies, and more particular to an organic light emitting diode (OLED) display panel and a display device including the OLED display panel.

(b) Description of the Prior Art

Conventional mice and keyboards have been gradually replaced by touch panels due to their more convenient and humanized design. The touch panels therefore are widely applied to various electronic products. Capacitive touch panels, due to their fast response, high sensitivity, superior reliability, and high robustness, have become the mainstream technology.

On the other hand, organic light emitting diode (OLED) display devices have advantages such as self-illumination, wide viewing angle, high efficiency, low power consumption, fast response, and therefore are widely popular in display products. Currently, an OLED touch panel have to produce the OLED panel and the touch panel separately, and then join them together. This is the so-called out-cell structure. This type of OLED touch panels has shortcomings such as low transmittance, greater thickness.

SUMMARY OF THE INVENTION

To obviate the shortcomings of the prior art, the present invention provides a novel OLED display panel having the touch structure embedded inside, thereby achieving simplified structure, low thickness, and high transmittance.

To achieve the objective, the present invention adopts the following technical solution.

The OLED display panel includes an array substrate, an encapsulation cover, and an organic lighting unit sealed between the array substrate and the encapsulation cover by encapsulation adhesive. A chip bonding element is configured on the array substrate. The encapsulation cover is configured with a touch electrode layer and first connection electrodes electrically connected to the touch electrode layer. The organic lighting unit includes a pixel definition layer. insulating support columns are disposed on the pixel definition layer. second connection electrodes are disposed on the support columns. Each second connection electrode is electrically connected to the chip bonding element. The support columns contact with the first connection electrodes. The first connection electrodes are electrically connected to second connection electrodes so that the touch electrode layer is electrically connected to the chip bonding element.

The pixel definition layer defines multiple pixel areas. The organic lighting unit includes an anode layer, an organic lighting layer, and a cathode layer of the pixel areas. and the second connection electrodes and the cathode layer are located in a same layer and formed in a same processing step.

The support columns are made of a flexible material, and have a height relative to the pixel definition layer under an uncompressed state greater than the distance between the first connection electrodes to the pixel definition layer.

The pixel definition layer is made of a flexible material. and the support columns and the pixel definition layer are integrally formed.

The pixel definition layer defines multiple pixel areas. The organic lighting unit includes an anode layer, an organic lighting layer, and a cathode layer of the pixel areas. and the second connection electrodes and the cathode layer are located in a same layer and formed in a same processing step.

The support columns are disposed on a top side of the pixel definition layer adjacent to the chip bonding element. The chip bonding element is disposed to an external lateral side of the encapsulation adhesive. and the support columns are disposed to an internal lateral side of the encapsulation adhesive.

The OLED display panel has an active area. and the support columns are disposed within or outside the active area of the OLED display panel.

The touch electrode layer includes multiple touch electrodes. The touch electrodes are connected to the first connection electrodes through touch signal wires. along a path of a touch signal wire, multiple first connection electrodes configured on the encapsulation cover are connected. same numbers of support columns and second connection electrodes as that of the first connection electrodes are configured on the pixel definition layer.

The OLED display panel may further include at least an insulating layer covering the organic lighting unit or the touch electrode layer except where the first and second connection electrodes are connected.

There may be an insulating adhesive layer fills up a space formed between the encapsulation cover and the organic lighting unit by the support columns' sustaining the encapsulation cover above the organic lighting unit.

The present invention also teaches a display device including a driver unit and a display panel whose driver signals are provided by the driver unit.

The display panel 100 is one having embedded touch structure as described in Embodiments 1 to 5. The driver signals include display driver signal and touch driver signal. The driver unit 200 includes a display driver chip and a touch driver chip, respectively connected to the chip bonding element on the array substrate. In some embodiments, the display driver chip and the touch driver chip may be integrated into a single chip providing both display and touch driver functions.

The OLED display panel and the display device have touch structure embedded in the OLED display panel. More specifically, the touch structure is configured on the encapsulation cover. The OLED display panel and the display device have advantages such as simplified structure, low thickness, and high transmittance. In addition, the support columns and the second connection electrodes are provided on the pixel definition layer by which the touch structure is electrically connected to the array substrate. The display driving and touch driving may commonly share the chip bonding element. Both bonding difficulty and cost is reduced.

Furthermore, in preferred embodiments, the support columns and the pixel definition layer are located in a same layer and integrally formed in a same processing step. The second connection electrodes and the cathode layer are located in a same layer, and formed in a same processing step. Therefore, the electrical connection of the touch structure on the encapsulation cover to the array substrate is achieved without additional processing steps, thereby reducing production cost.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

To make the technical solution of the embodiments according to the present invention, a brief description of the drawings that are necessary for the illustration of the embodiments will be given as follows.

Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention.

Various changes to the described embodiments may be made in the function and arrangement of the elements described without departing from the scope of the invention as set forth in the appended claims.

Embodiment 1

Figure 1:
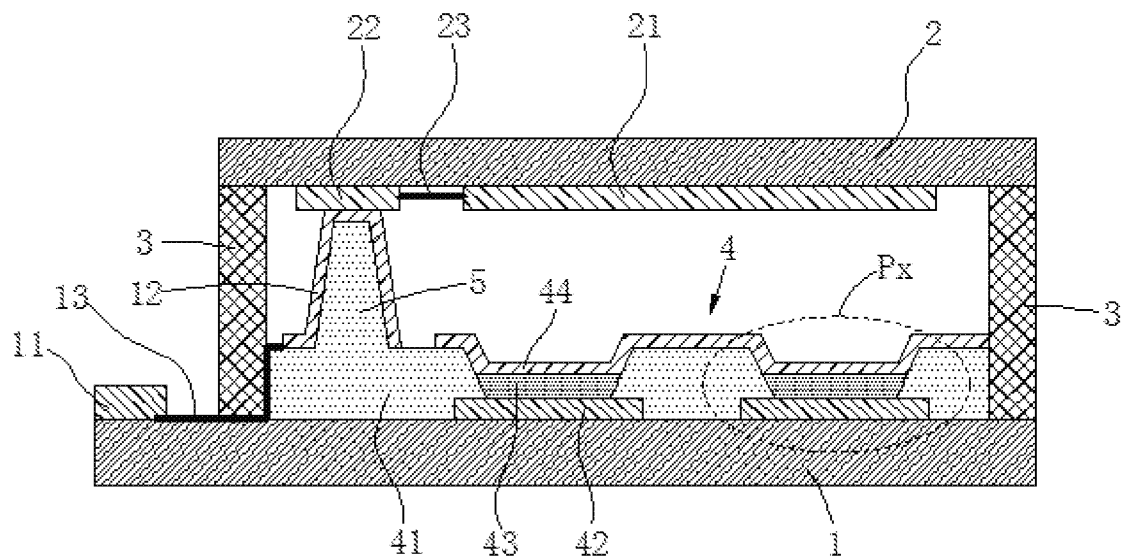
FIG. 1 is a schematic structural diagram showing an OLED display panel according to a first embodiment of the present invention.

An OLED display panel according to an embodiment of the present invention, as shown in FIG. 1, includes an array substrate 1, an encapsulation cover 2, an encapsulation adhesive 3, and an organic lighting unit 4. The array substrate 1 and the encapsulation cover 2 are disposed oppositely. The organic lighting unit 4 is disposed and sealed between the array substrate 1 and the encapsulation cover 2.

The array substrate 1 is a thin film transistor (TFT) array substrate. At least a chip bonding element 11 is provided on the array substrate 1. The encapsulation cover 2 is configured with a touch electrode layer 21 and first connection electrodes 22 electrically connected to the touch electrode layer 21. The organic lighting unit 4 includes a pixel definition layer 41. Insulating support columns 5 are disposed on the pixel definition layer 41. A second connection electrode 12 is disposed on each support column 5 electrically connecting the chip bonding element 11.

Each support column 5 reaches a first connection electrode 22 so that the first connection electrode 22 is electrically connected to the second connection electrode 12, which in turn is electrically to the chip bonding element 11.

According to the present embodiment, the OLED display panel has the touch structure embedded in the OLED display panel. Specifically, the touch structure (i.e., the touch electrode layer 21) is configured on the encapsulation cover 2. The OLED display panel has advantages such as simplified structure, low thickness, and high transmittance. In addition, the support columns 5 and the second connection electrodes 12 are provided on the pixel definition layer 4 by which the touch structure is electrically connected to the array substrate 1. The display driving and touch driving may commonly share the chip bonding element 11. Both bonding difficulty and cost is reduced. Furthermore, the display driving and touch driving may also share a common driver chip achieving touch and display driver integration (TDDI).

The array substrate 1 has a display driver circuit (not shown) which includes an array of TFTs, and wirings for data and gate lines. The array substrate 1 may be a rigid substrate such as a glass substrate, or a flexible substrate such as one made of polymer material like polyimide (PI), polycarbonate (PC), (PES), polyethylene terephthalate (PET), polyethylene naphthalate (PEN), polyether sulfones (PES), polyarylate (PAR) compound, fiber reinforced plastics (FRP) The pixel definition layer 41 defines multiple pixel areas Px where two of them are exemplarily shown in FIG. 1. The organic lighting unit 4 includes an anode layer 42, an organic lighting layer 43, and a cathode layer 44 of these pixel areas Px. Usually, the organic lighting layer 43 includes a first common layer for transmitting holes, an emissive layer (EML), and a second common layer for transmitting electrons, sequentially stacked on the anode layer 42. The first common layer includes a hole injection layer (HIL) and a hole transport layer (HTL) sequentially stacked towards a direction away from the anode layer 42.

The second common layer includes an electron injection layer (EIL) and an electron transport layer (ETL) sequentially stacked towards a direction away from the cathode layer 44.

In the present embodiment, as shown in FIG. 1, the support columns 5 are disposed on a top side of the pixel definition layer 41 adjacent to the chip bonding element 11. The chip bonding element 11 is disposed to an external lateral side of the encapsulation adhesive 3. The support columns 5 are to an internal lateral side of the encapsulation adhesive 3. The second connection electrodes 12 are electrically connected to the chip bonding element 11 through connection wires 13, and to the first connection electrodes 22 through touch signal wires 23. The touch electrode layer 21 may adopt a self-capacitance or mutual-capacitance touch electrode structure whose electrode and wiring is electrically connected to the chip bonding element 11 according to the present embodiment's solution.

Figure 2:
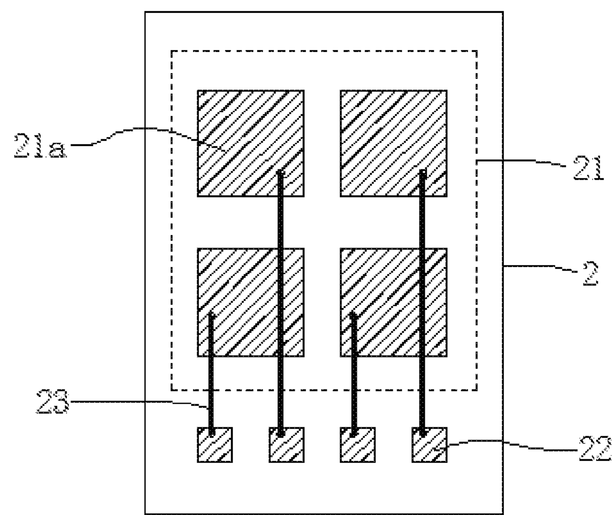
FIG. 2 is a schematic diagram showing a layout of first connection electrodes of the OLED display panel of FIG. 1.
Figure 3:
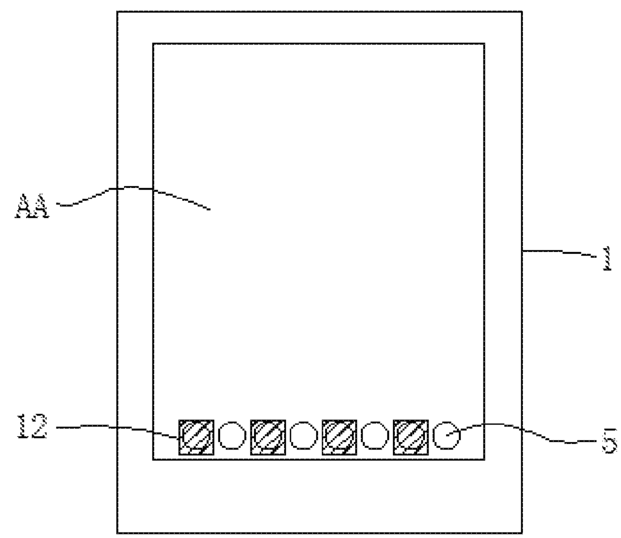
FIG. 3 is a schematic diagram showing a layout of support columns and second connection electrodes of the OLED display panel of FIG. 1.

In the present embodiment, specifically, the touch electrode layer 21 includes multiple touch electrodes 21*a* where a subset of them is exemplarily shown in FIG. 2. Each touch electrode 21*a* is connected to a first connection electrode 22 via a touch signal wire 23. These touch electrode 21*a* are located in a same layer, and these first connection electrodes 22 are aligned at intervals into a row. These touch signal wires 23 are located in another layer other than the one where the touch electrode layer 21 is located with an insulating layer between the two layers. The touch signal wires 23 run through vias of the insulating layer to electrically connect the touch electrodes 21*a* and the first connection electrodes 22. Correspondingly, as shown in FIG. 3, the support columns 5 are disposed on the array substrate 1 within the active area (AA) of the OLED display panel. These support columns 5 are aligned at intervals into a row. Each first connection electrode 22 is right above a support column 5. The second connection electrodes 12 are on the support columns 5. There are corresponding numbers of first and second connection electrodes 22 and 12, and the first and second connection electrodes 22 and 12 are also arranged correspondingly.

It should be noted that, as shown in FIG. 3, there may be more support columns 5 than the first connection electrodes 22, and some support columns 5 have the second connection electrodes 12 configured and some don't, as long as the first and second connection electrodes 22 and 12 have one-to-one correspondence.

The support columns 5 are made of a flexible material. As shown in FIG. 1, each support column 5 is extended from the pixel definition layer 41 and has a height relative to the pixel definition layer 41 under an uncompressed state greater than the distance between the corresponding first connection electrode 22 to the pixel definition layer 41. Then, after the encapsulation cover 2 and the array substrate 1 are joined by the encapsulation adhesive 3, superior electrical contact is achieved between the first and second connection electrodes 22 and 12, as the support columns 5 are compressed by the contact between the first and second connection electrodes 22 and 12. In the present embodiment, the pixel definition layer 41 is also made of a flexible material, and the support columns 5 and the pixel definition layer 41 are integrally formed. In other words, the support columns 5 and the pixel definition layer 41 are formed in a same processing step. Furthermore, in the present embodiment, the second connection electrodes 12 and the cathode layer 44 are located in a same layer, as shown in FIG. 1. They are formed in a same processing step. Therefore, the present embodiment achieves the electrical connection of the touch structure on the encapsulation cover to the array substrate without additional processing steps, thereby reducing production cost.

Embodiment 2

Figure 4:
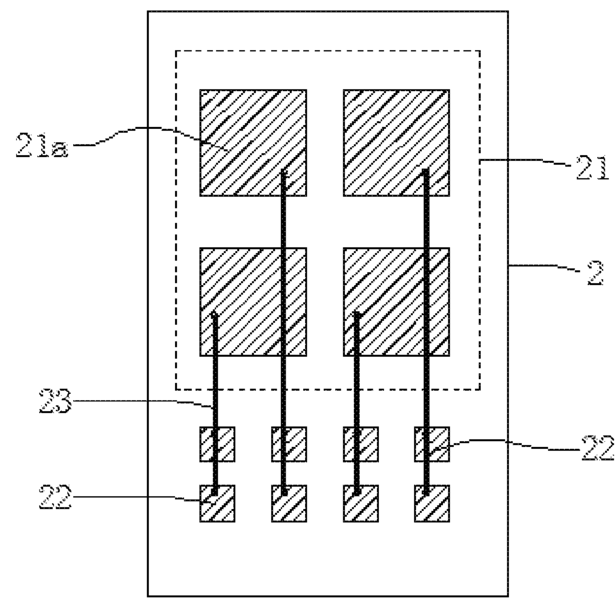
FIG. 4 is a schematic diagram showing a layout of first connection electrodes of an OLED display panel according to a second embodiment of the present invention.
Figure 5:
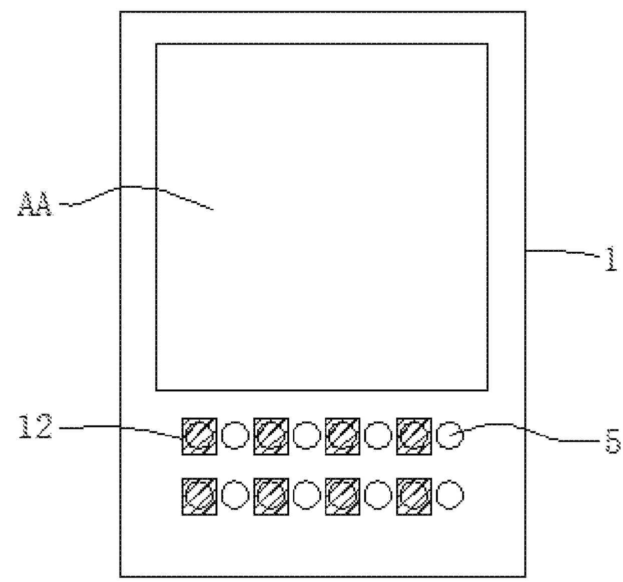
FIG. 5 is a schematic diagram showing a layout of support columns and second connection electrodes of the OLED display panel of FIG. 4.

The present embodiment is different from Embodiment 1 in that, as shown in FIGS. 4 and 5, the support columns 5, and the first and second connection electrodes 22 and 12 are arranged differently.

As shown in FIG. 4, the touch electrode layer 21 on the encapsulation cover 2 includes multiple touch electrodes 21*a* where a subset of them is exemplarily shown in FIG. 4. Each touch electrode 21*a* is connected to two first connection electrodes 22 via a touch signal wire 23. These touch electrode 21*a* are located in a same layer, and these first connection electrodes 22 are aligned at intervals into two rows.

As shown in FIG. 5, the support columns 5 are disposed on the array substrate 1 outside the active area (AA) of the OLED display panel. The support columns 5 are arranged at intervals into two rows. Each first connection electrode 22 is right above a support column 5. The second connection electrodes 12 are on the support columns 5. There are corresponding numbers of first and second connection electrodes 22 and 12, and the first and second connection electrodes 22 and 12 are also arranged correspondingly.

It should be understood that, along the path of a touch signal wire, there are two (more may be possible in alternative embodiments) first connection electrodes 22 on the encapsulation cover 2. Correspondingly, a same number of second connection electrodes 12 are configured on the array substrate 1. By providing more connection points for the first and second connection electrodes 22 and 12 along the path of the touch signal wires 23, the electrical connectivity is enhanced between the first and second connection electrodes 22 and 12.

Embodiment 3

Figure 6:
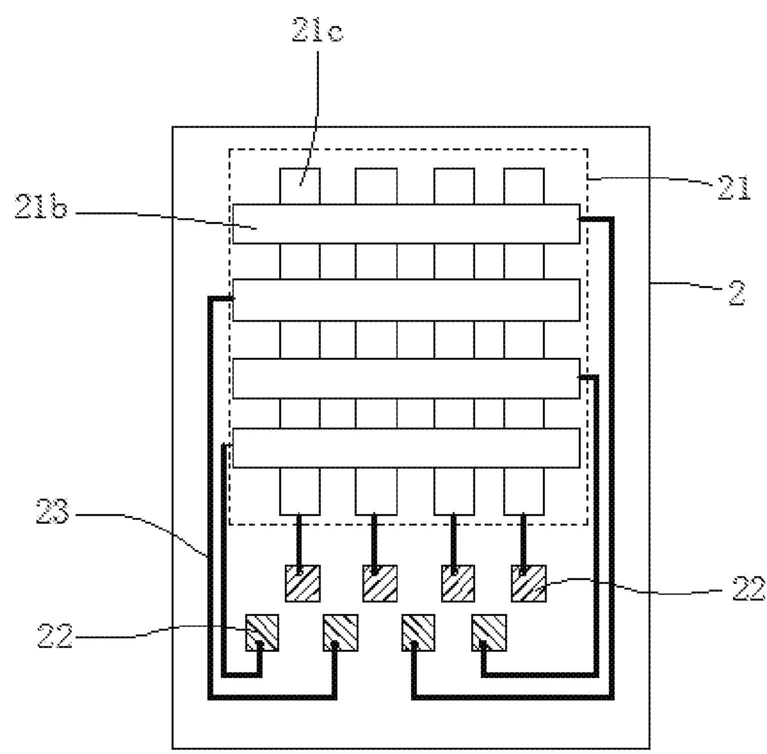
FIG. 6 is a schematic diagram showing a layout of first connection electrodes of an OLED display panel according to a third embodiment of the present invention.
Figure 7:
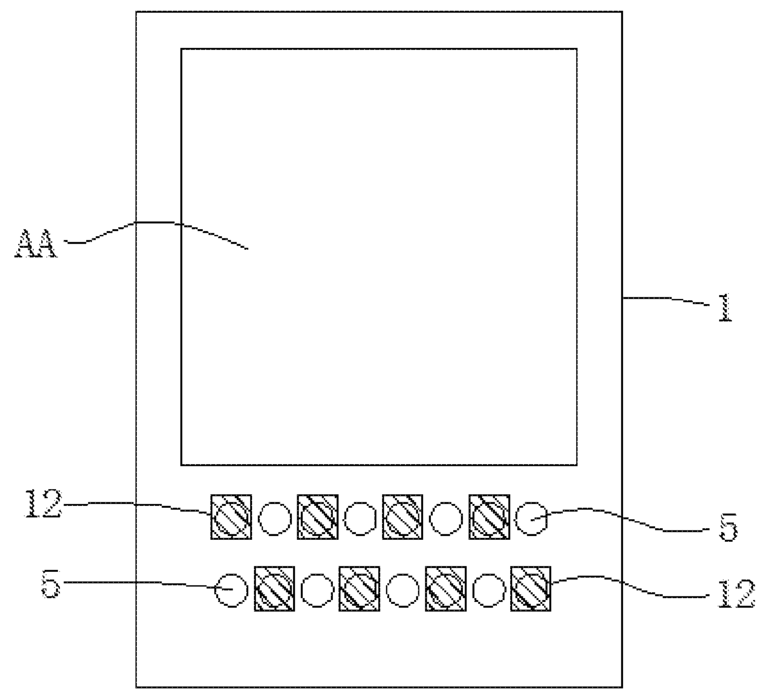
FIG. 7 is a schematic diagram showing a layout of support columns and second connection electrodes of the OLED display panel of FIG. 6.

The present embodiment is different from Embodiment 1 in that, as shown in FIGS. 6 and 7, the support columns 5, and the first and second connection electrodes 22 and 12 are arranged differently.

As shown in FIG. 6, the touch electrode layer 21 on the encapsulation cover 2 includes multiple first touch electrodes 21*b* and second touch electrodes 21*c*, where the first and second touch electrodes 21*b* and 21*c* are insulated and located different layers (insulating layer is not shown in FIG. 6). Each of the first and second touch electrodes 21*b* and 21*c* is connected to a first connection electrode 22 via a touch signal wire 23.

These first connection electrodes 22 are aligned at intervals into two rows, and the first connection electrodes 22 in one is staggered from the first connection electrodes 22 in the other row.

As shown in FIG. 7, the support columns 5 are disposed on the array substrate 1 outside the active area (AA) of the OLED display panel. The support columns 5 are arranged at intervals into two rows. Each first connection electrode 22 is right above a support column 5. The second connection electrodes 12 are on the support columns 5. There are corresponding numbers of first and second connection electrodes 22 and 12, and the first and second connection electrodes 22 and 12 are also arranged correspondingly.

Embodiment 4

Figure 8:
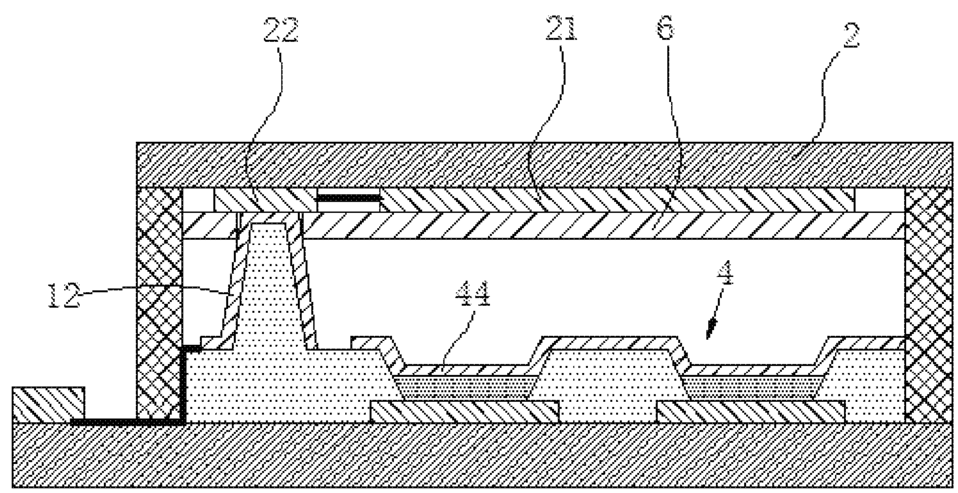
FIG. 8 is a schematic structural diagram showing an OLED display panel according to a fourth embodiment of the present invention.

The present embodiment is different from Embodiment 1 to 3 in that, as shown in FIG. 8, an additional insulating layer 6 is provided on the encapsulation cover 2. The insulating layer 6 covers the touch electrode layer 21 except where the first and second connection electrodes 22 and 12 are connected. The provision of the insulating layer 6 prevents the touch electrode layer 21 from electrically contacting the cathode layer 44 at unnecessary locations.

It should be understood that, in alternative embodiments, the insulating layer 6 may be disposed on the organic lighting unit 4, or both the touch electrode layer 21 and the organic lighting unit 4 have insulating layers 6 configured.

Embodiment 5

Figure 9:
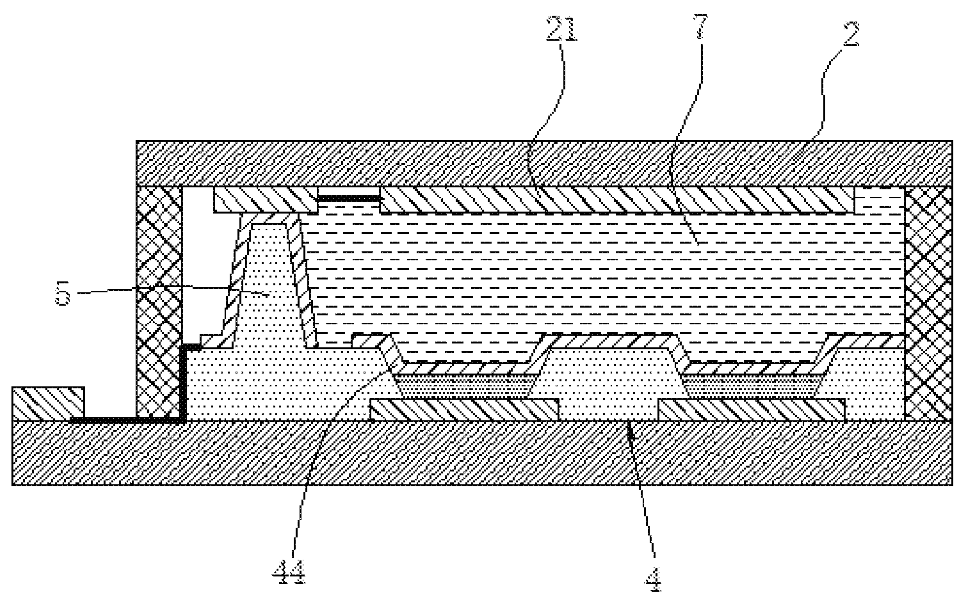
FIG. 9 is a schematic structural diagram showing an OLED display panel according to a fifth embodiment of the present invention.

The present embodiment is different from Embodiment 1 to 3 in that, as shown in FIG. 9, an insulating adhesive layer 7 fills up a space formed between the encapsulation cover 2 and the organic lighting unit 4 by the support columns 5's sustaining the encapsulation cover 2 above the organic lighting unit 4. The insulating adhesive layer 7 not only prevents the touch electrode layer 21 from electrically contacting the cathode layer 44 at unnecessary locations, but also provides additional support to the encapsulation cover 2 so that the OLED display panel has a more uniform and steadier thickness.

Embodiment 6

Figure 10:
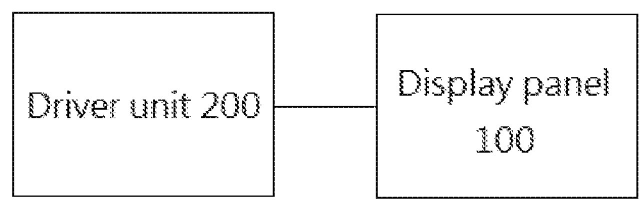
FIG. 10 is a block diagram showing a display device according to an embodiment of the present invention.

The present embodiment provides a display device. As shown in FIG. 10, the display device includes a driver unit 200 and a display panel 100 whose driver signals are provided by the driver unit 200. The display panel 100 is one having embedded touch structure as described in Embodiments 1 to 5. The driver signals include display driver signal and touch driver signal. The driver unit 200 includes a display driver chip and a touch driver chip, respectively connected to the chip bonding element on the array substrate. In some embodiments, the display driver chip and the touch driver chip may be integrated into a single chip providing both display and touch driver functions.

As described above, the OLED display panel and display device have the touch structure embedded in the OLED display panel, and have advantages such as simplified structure, low thickness, and high transmittance.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

What is claimed is:

1. An organic light emitting diode (OLED) display panel, comprising an array substrate, an encapsulation cover, and an organic lighting unit sealed between the array substrate and the encapsulation cover by encapsulation adhesive; wherein a chip bonding element is configured on the array substrate;

the encapsulation cover is configured with a touch electrode layer and a plurality of first connection electrodes;

the first connection electrodes are aligned at intervals in two rows;

the organic lighting unit comprises a pixel definition layer;

a plurality of insulating support columns are disposed on the pixel definition layer;

a plurality of second connection electrodes are disposed respectively on the support columns;

each second connection electrode is electrically connected to the chip bonding element;

the support columns contact with the first connection electrodes;

the touch electrode layer comprises a plurality of touch electrodes, each connected to at least a first connection electrode through a touch signal wire;

each first connection electrodes is electrically connected to a second connection electrodes so that each touch electrode is electrically connected to the chip bonding element; and a same number of support columns and second connection electrodes as that of the first connection electrodes are configured on the pixel definition layer;

wherein each touch electrode is connected through a signal wire to a first connection electrode in a row and another first connection electrode in another row.

2. The OLED display panel according to claim 1, wherein the pixel definition layer defines a plurality of pixel areas; the organic lighting unit comprises an anode layer, an organic lighting layer, and a cathode layer of the pixel areas; and the second connection electrodes and the cathode layer are located in a same layer and formed in a same processing step.

3. The OLED display panel according to claim 1, wherein the support columns are made of a flexible material, and have a height relative to the pixel definition layer under an uncompressed state greater than the distance between the first connection electrodes to the pixel definition layer.

4. The OLED display panel according to claim 3, wherein the pixel definition layer is made of a flexible material; and the support columns and the pixel definition layer are integrally formed.

5. The OLED display panel according to claim 4, wherein the pixel definition layer defines a plurality of pixel areas; the organic lighting unit comprises an anode layer, an organic lighting layer, and a cathode layer of the pixel areas; and the second connection electrodes and the cathode layer are located in a same layer and formed in a same processing step.

6. The OLED display panel according to claim 4, wherein the support columns are disposed on a top side of the pixel definition layer adjacent to the chip bonding element; the chip bonding element is disposed to an external lateral side of the encapsulation adhesive; and the support columns are disposed to an internal lateral side of the encapsulation adhesive.

7. The OLED display panel according to claim 6, wherein the OLED display panel has an active area; and the support columns are disposed within or outside the active area of the OLED display panel.

8. The OLED display panel according to claim 1, further comprising at least an insulating layer covering the organic lighting unit or the touch electrode layer except where the first and second connection electrodes are connected.

9. The OLED display panel according to claim 1, wherein an insulating adhesive layer fills up a space formed between the encapsulation cover and the organic lighting unit by the support columns sustaining the encapsulation cover above the organic lighting unit.

10. A display device, comprising a driver unit and an OLED display panel whose driver signals are provided by the driver unit; wherein the OLED display panel comprises an array substrate, an encapsulation cover, and an organic lighting unit sealed between the array substrate and the encapsulation cover by encapsulation adhesive;

a chip bonding element is configured on the array substrate;

the encapsulation cover is configured with a touch electrode layer and a plurality of first connection electrodes;

the first connection electrodes are aligned at intervals in two rows;

the organic lighting unit comprises a pixel definition layer;

a plurality of insulating support columns are disposed on the pixel definition layer;

a plurality of second connection electrodes are disposed respectively on the support columns;

each second connection electrode is electrically connected to the chip bonding element;

the support columns contact with the first connection electrodes;

the touch electrode layer comprises a plurality of touch electrodes, each connected to at least a first connection electrode through a touch signal wire;

each first connection electrode is electrically connected to a second connection electrode so that each touch electrode is electrically connected to the chip bonding element; and a same numbers of support columns and second connection electrodes as that of the first connection electrodes are configured on the pixel definition layer;

wherein each touch electrode is connected through a signal wire to a first connection electrode in a row and another first connection electrode in another row.

11. The display device according to claim 10, wherein the pixel definition layer defines a plurality of pixel areas; the organic lighting unit comprises an anode layer, an organic lighting layer, and a cathode layer of the pixel areas; and the second connection electrodes and the cathode layer are located in a same layer and formed in a same processing step.

12. The display device according to claim 10, wherein the support columns are made of a flexible material, and have a height relative to the pixel definition layer under an uncompressed state greater than the distance between the first connection electrodes to the pixel definition layer.

13. The display device according to claim 12, wherein the pixel definition layer is made of a flexible material; and the support columns and the pixel definition layer are integrally formed.

14. The display device according to claim 13, wherein the pixel definition layer defines a plurality of pixel areas; the organic lighting unit comprises an anode layer, an organic lighting layer, and a cathode layer of the pixel areas; and the second connection electrodes and the cathode layer are located in a same layer and formed in a same processing step.

15. The display device according to claim 13, wherein the support columns are disposed on a top side of the pixel definition layer adjacent to the chip bonding element; the chip bonding element is disposed to an external lateral side of the encapsulation adhesive; and the support columns are disposed to an internal lateral side of the encapsulation adhesive.

16. The display device according to claim 15, wherein the OLED display panel has an active area; and the support columns are disposed within or outside the active area of the OLED display panel.

17. The display device according to claim 10, further comprising at least an insulating layer covering the organic lighting unit or the touch electrode layer except where the first and second connection electrodes are connected.

18. The display device according to claim 10, wherein an insulating adhesive layer fills up a space formed between the encapsulation cover and the organic lighting unit by the support columns sustaining the encapsulation cover above the organic lighting unit.

* * * * *